United States Patent
Kim et al.

(10) Patent No.: US 8,455,870 B2
(45) Date of Patent: Jun. 4, 2013

(54) THIN FILM TRANSISTOR ARRAY PANEL AND METHOD OF MANUFACTURING THE SAME

(75) Inventors: Jong-In Kim, Suwon-si (KR); Jang-Soo Kim, Yongin-si (KR); Hong-Suk Yoo, Anyang-si (KR); Yong-Hwan Kim, Seongnam-si (KR); Hwa-Yeul Oh, Asan-si (KR); Jae-Ho Choi, Seoul (KR); Sang-Hee Jang, Bucheon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 375 days.

(21) Appl. No.: 12/689,814

(22) Filed: Jan. 19, 2010

(65) Prior Publication Data

US 2011/0049519 A1 Mar. 3, 2011

(30) Foreign Application Priority Data

Aug. 26, 2009 (KR) ........................ 10-2009-0079467

(51) Int. Cl.
*H01L 33/00* (2010.01)
(52) U.S. Cl.
USPC ............... 257/59; 257/40; 257/72; 257/98; 257/E33.053; 257/E21.158; 438/29; 349/106
(58) Field of Classification Search
USPC ............... 257/59, E33.053, E21.158; 438/29
See application file for complete search history.

(56) References Cited

U.S. PATENT DOCUMENTS

| | | | |
|---|---|---|---|
| 2004/0246410 A1* | 12/2004 | Kim | 349/110 |
| 2007/0024791 A1* | 2/2007 | Nishida | 349/141 |
| 2007/0064179 A1 | 3/2007 | Park et al. | |
| 2008/0087904 A1* | 4/2008 | Heo et al. | 257/89 |
| 2009/0057671 A1 | 3/2009 | Ryu et al. | |

FOREIGN PATENT DOCUMENTS

| | | |
|---|---|---|
| JP | 11-052419 | 2/1999 |
| JP | 11-212115 | 8/1999 |
| JP | 11-212118 | 8/1999 |
| JP | 2001-100652 | 4/2001 |
| KR | 10-0436011 | 6/2004 |
| KR | 10-2004-0104202 | 12/2004 |
| KR | 10-2005-0080313 | 8/2005 |
| KR | 10-2006-0112042 | 10/2006 |
| KR | 10-2008-0034545 | 4/2008 |
| KR | 10-2008-0096879 | 11/2008 |

OTHER PUBLICATIONS

English Abstract for Publication No. 11-052419, Feb. 26, 1999.
English Abstract for Publication No. 11-212118, Aug. 6, 1999.
English Abstract for Publication No. 11-212115, Aug. 6, 1999.

(Continued)

*Primary Examiner* — Minh-Loan T Tran
*Assistant Examiner* — Fazli Erdem
(74) *Attorney, Agent, or Firm* — F. Chau & Associates, LLC

(57) ABSTRACT

A thin film transistor array panel includes an insulation substrate. A signal line is formed on the insulation substrate. A thin film transistor is connected to the signal line. A color filter is formed on the substrate. An organic insulator is formed on the color filter and includes a first portion and a second portion having different thicknesses. A light blocking member is formed on the second portion of the organic insulator. A difference between the surface height of the first portion of the organic insulator and the surface height of the second portion of the organic insulator is in the range of about 2.0 μm to 3.0 μm.

19 Claims, 17 Drawing Sheets

OTHER PUBLICATIONS

English Abstract for Publication No. 2001-100652, Apr. 13, 2001.
English Abstract for Publication No. 10-0436011, Jun. 3, 2004.
English Abstract for Publication No. 10-004-0104202, Dec. 10, 2004.
English Abstract for Publication No. 10-2005-0080313, Aug. 12, 2005.
English Abstract for Publication No. 10-2006-0112042, Dec. 10, 2004.
English Abstract for Publication No. 10-008-0034545, Apr. 22, 2008.
English Abstract for Publication No. 10-2008-0096879, Nov. 4, 2008.

* cited by examiner

THIN FILM TRANSISTOR ARRAY PANEL AND METHOD OF MANUFACTURING THE SAME

CROSS-REFERENCE TO RELATED APPLICATION

This application claims priority to Korean Patent Application No. 10-2009-0079467 filed in the Korean Intellectual Property Office on Aug. 26, 2009, the entire contents of which are incorporated herein by reference.

BACKGROUND (a) Technical Field

The present invention relates to thin film transistors, and more particularly, to a thin film transistor array panel and a manufacturing method thereof.

(b) Discussion of the Related Art

Liquid crystal displays (LCDs) are one of the most widely used forms of flat panel displays. An LCD includes a pair of panels provided with field-generating electrodes and a liquid crystal (LC) layer interposed between the two panels. The LCD displays images by applying voltages to the field-generating electrodes to generate an electric field in the LC layer that determines the orientation of LC molecules therein to adjust polarization of incident light.

Among the various forms of LCDs, an LCD having a structure in which field generating electrodes are respectively formed on two display panels is widely used. The two display panels include a thin film transistor array panel and a common electrode panel. A plurality of pixel electrodes and thin film transistors are arranged in a matrix format on the thin film transistor array panel. Color filters of red, green, and blue and a light blocking member are formed on the common electrode panel and one common electrode covers the entire surface of the common electrode panel.

In such a liquid crystal display, the pixel electrodes and the color filters are disposed on different display panels such that it may be difficult to properly align the two display panels with each other, thereby potentially generating an alignment error.

A color filter on array (COA) structure in which the pixel electrodes and the color filters are formed on the same display panel may be provided to avoid the potential problem of having to align multiple display panels. In this structure, a light blocking member and the color filter are formed on the same display panel as the pixel electrode.

After forming the color filter on the display panel on which the pixel electrode will be formed, an organic layer having a predetermined thickness is formed to prevent particles of the color filter from diffusing into the pixel electrode or the liquid crystal layer. Then the pixel electrode and the light blocking member are formed on the organic layer. Here, the surface of the light blocking member is higher than the other layers such that the light blocking member may protrude upward. In this case, the cell gap of the liquid crystal display is non-uniform and the average cell gap is reduced. Also, when the organic layer formed on the color filter is relatively thin, the material of the organic layer coated at the edge of the color filter tends to diffuse into a neighboring region because of the steep step shape between the color filter and the other layers make it difficult to cover the edge of the color filters with the organic layer. Additionally, when the organic layer is relatively thick, a portion of the organic layer that would otherwise be removed may remain when forming the contact hole such that the contact characteristic of the contact hole may be reduced. Reduction of the contact characteristic may be expressed as a partial or complete obstruction of the contact hole by excess material of the organic layer that interferes with electrical conduction between conductive lines that are connected therethrough.

SUMMARY

Exemplary embodiments of the present invention maintain a uniform cell gap of the liquid crystal display, and prevent deterioration of the contact characteristic of contact holes while completely covering the color filter.

A thin film transistor array panel according to an exemplary embodiment of the present invention includes an insulation substrate, a signal line formed on the insulation substrate, a thin film transistor connected to the signal line, a color filter formed on the substrate, an organic insulator formed on the color filter and including a first portion and a second portion having different thicknesses depending on positions, and a light blocking member formed on the second portion of the organic insulator. The difference between the surface height of the first portion of the organic insulator and the surface height of the second portion of the organic insulator is in the range of about 2.0 μm to 3.0 μm.

The thickness of the light blocking member may be in the range of about 2.0 μm to 3.0 μm.

The difference between the surface height of the first portion the organic layer and the surface height of the light blocking member may be less than about 0.5 μm.

The signal line may include an end portion, and the organic insulator further may include a third portion having a different thickness from the first portion and the second portion and disposed near the end portion of the signal line.

The thickness of the third portion of the organic insulator may be in the range of about 0.5 μm to 1.0 μm.

A pixel electrode electrically connected to the thin film transistor through a contact hole may be further included, and the contact hole may be disposed in the second portion of the organic insulator.

The pixel electrode may include a plurality of minute branches, and the direction of the edges of the minute branches may be different.

The edges of the minute branches may form and angle of 45° or 135° with the signal line.

The thickness of the color filter may be in the range of about 1.0 μm to 2.5 μm.

A spacer made with the same layer as the light blocking member may be further included.

A manufacturing method of a thin film transistor array panel according to an exemplary embodiment of the present invention includes forming a thin film transistor connected to a plurality of signal lines on a substrate, forming a lower passivation layer on the thin film transistor and the substrate, forming a color filter on the lower passivation layer, forming an upper passivation layer including a first portion and a second portion with different thicknesses on the lower passivation layer and the color filter, and forming a light blocking member on the second portion of the organic insulator. The difference between the surface height of the first portion of the organic insulator and the surface height of the second portion of the organic insulator is in the range of about 2.0 μm to 3.0 μm.

The forming of the upper passivation layer may include exposing a photosensitive film to light using an exposure mask having a translucent region as well as a transmissive region and a light blocking region.

The difference between the surface height of the first portion the organic layer and the surface height of the light blocking member may be less than about 0.5 μm.

The thickness of the light blocking member may be in the range of about 2.0 μm to 3.0 μm.

The method may further include forming a contact hole in the second portion of the upper passivation layer.

The method may further include forming a pixel electrode connected to the thin film transistor through the contact hole. The formation of the pixel electrode may include forming a conductive layer on the color filter and the upper passivation layer, coating a photosensitive film on the conductive layer and exposing and developing it to form a photosensitive film pattern, and etching the conductive layer by using the photosensitive film pattern as a mask. The photosensitive film may have negative photosensitivity.

The upper passivation layer may further include a third portion having a different thickness from the first portion and the second portion.

The thickness of the third portion of the upper passivation layer may be in the range of about 0.5 μm to 1.0 μm.

The forming of the light blocking member may include forming a spacer made with the same layer as the light blocking member.

As described above, the surface height of the light blocking member is almost equal to the surface height of the organic layer such that a uniform cell gap of the liquid crystal display may be maintained. The organic layer does not remain upon forming the contact hole. The organic layer completely covers the color filter by controlling the height of the organic layer per the regions such that the contact characteristics may not be deteriorated.

BRIEF DESCRIPTION OF THE DRAWINGS

The above and other features and aspects of the exemplary embodiments of the present invention will be described in detail with reference to the accompanying drawings, in which.

DETAILED DESCRIPTION OF EXEMPLARY EMBODIMENTS

Figure 1:
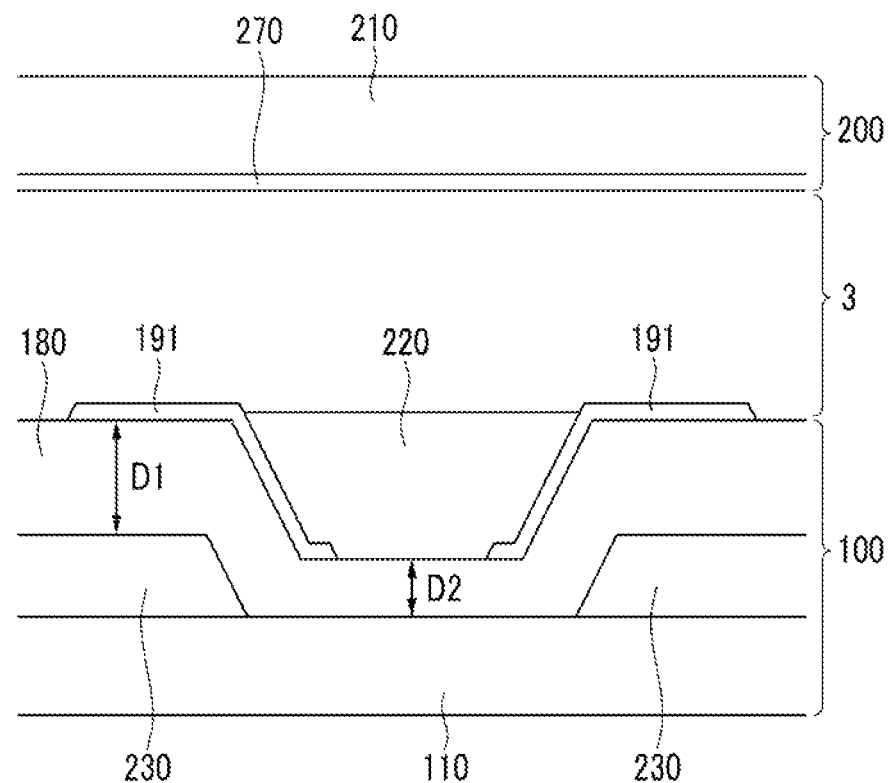
FIG. 1 is a schematic view of a liquid crystal display according to an exemplary embodiment of the present invention.

Exemplary embodiments of the present invention will be described more fully hereinafter with reference to the accompanying drawings. The described exemplary embodiments may be modified in various different ways, all without departing from the spirit or scope of the present invention.

In the drawings, the thickness of layers, films, panels, regions, etc., may be exaggerated for clarity. Like reference numerals may designate like elements throughout the specification. It will be understood that when an element such as a layer, film, region, or substrate is referred to as being "on" another element, it can be directly on the other element or intervening elements may also be present.

A liquid crystal display according to an exemplary embodiment of the present invention is described in detail below with reference to FIG. 1.

FIG. 1 is a schematic view of a liquid crystal display according to an exemplary embodiment of the present invention.

As shown in FIG. 1, a liquid crystal display according to an exemplary embodiment of the present invention includes a lower panel 100 and an upper panel 200 facing each other, and a liquid crystal layer 3 interposed therebetween.

The lower panel 100 includes a substrate 110, a color filter 230 formed on the substrate 110, an organic insulator 180 formed on the substrate 110 and the color filter 230, a pixel electrode 191 formed on the organic insulator 180, and a light blocking member 220 formed on the organic insulator 180 and the pixel electrode 191.

The upper panel 200 includes a common electrode 270 formed on a substrate 210.

The organic insulator 180 includes a first portion having a thickness D1 disposed on the color filter 230, and a second portion having a thickness D2 that is thicker than the first portion. The difference of the surface height of the first portion and the surface height of the second portion may be in the range of about 2.0 μm to 3.0 μm.

The light blocking member 220 is disposed on the second portion of the organic insulator 180 (D2), and the thickness of the light blocking member 220 may be equal to the height difference between the first portion (D1) plus the thickness of the color filter 230 and the second portion (D2) of the organic insulator 180.

Figure 2:
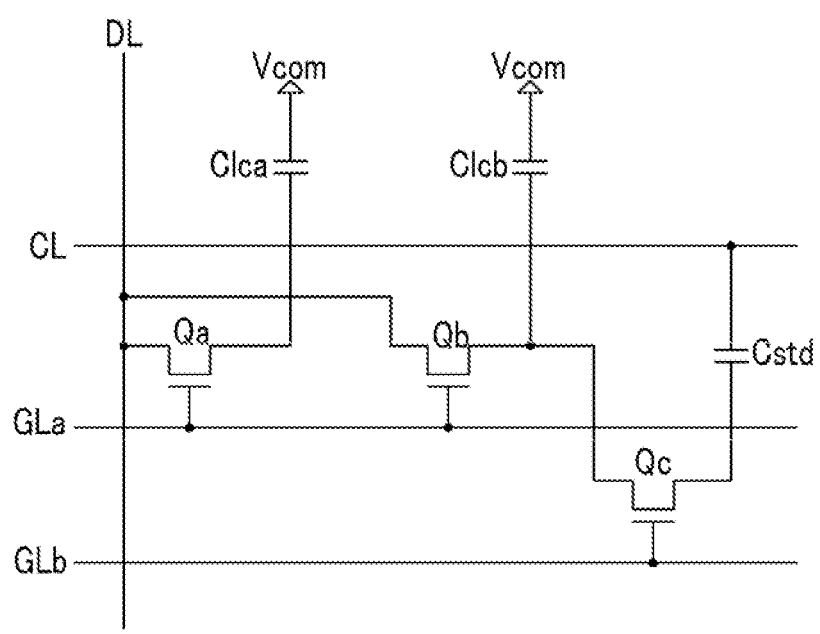
FIG. 2 is an equivalent circuit diagram of a pixel of a liquid crystal display according to an exemplary embodiment of the present invention.
Figure 3:
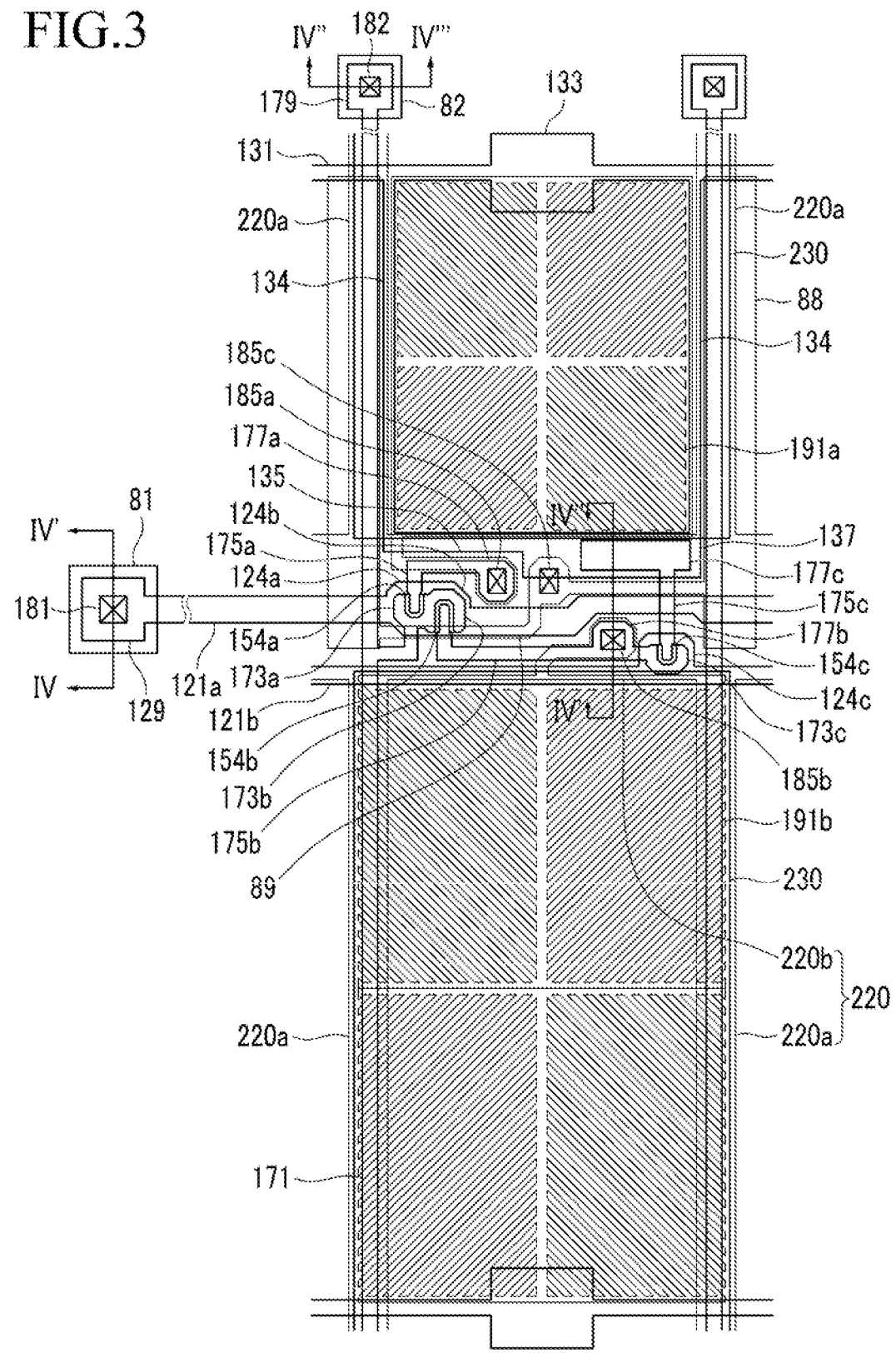
FIG. 3 is a layout view of a liquid crystal display according to an exemplary embodiment of the present invention.
Figure 4:
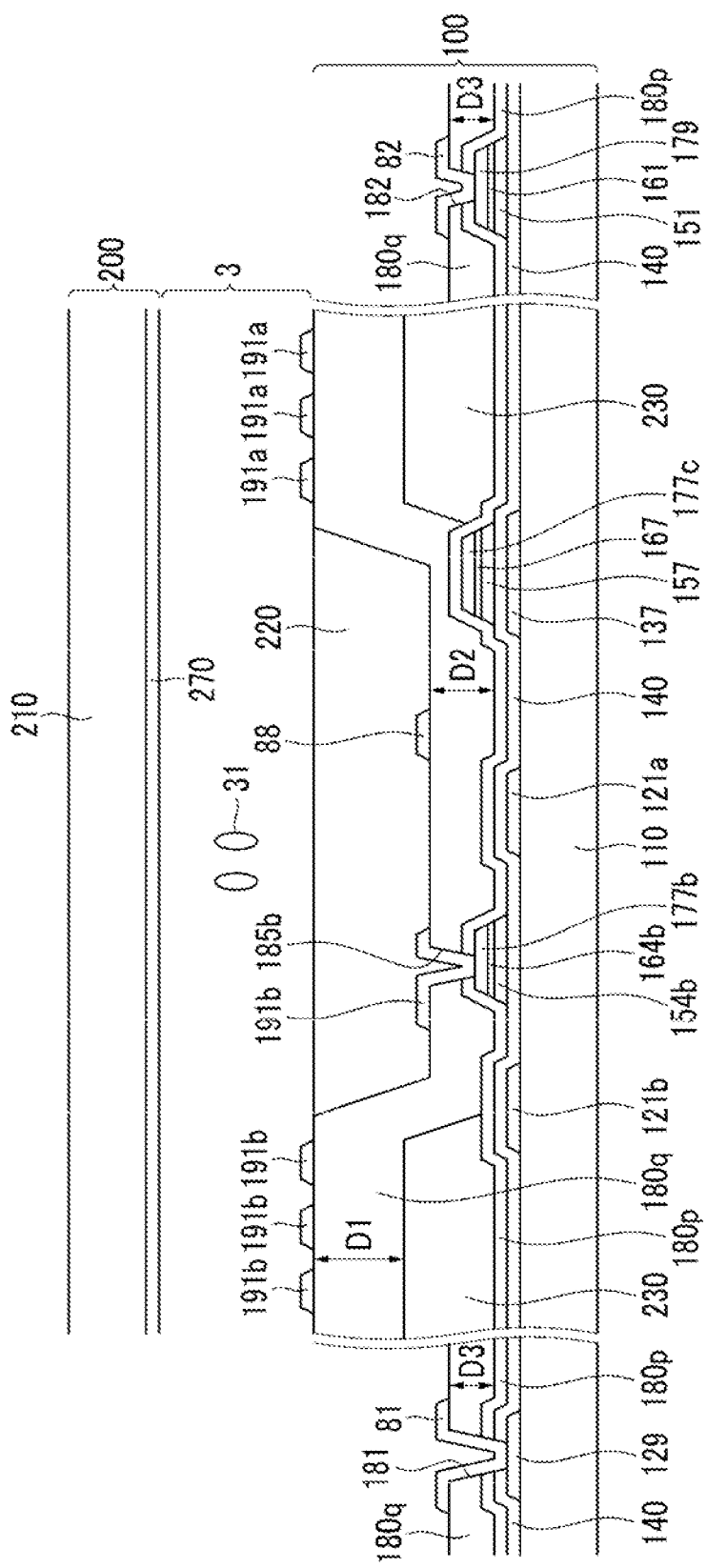
FIG. 4 is a cross-sectional view of the liquid crystal display shown in FIG. 3 taken along the lines IV-IV', IV'-IV", and IV"-IV'''.
Figure 5:
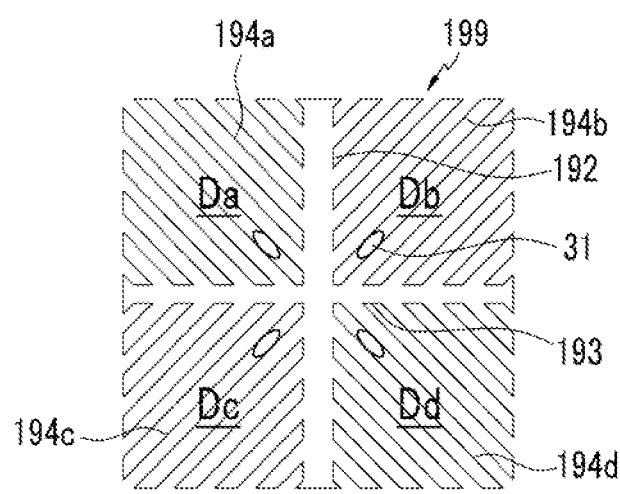
FIG. 5 is a layout view of the pixel electrode of the liquid crystal display of FIG. 4.

A liquid crystal display according to an exemplary embodiment of the present invention is described in detail below with reference to FIGS. 2 to 5. FIG. 2 is an equivalent circuit diagram of a pixel of a liquid crystal display according to an exemplary embodiment of the present invention, FIG. 3 is a layout view of a liquid crystal display according to an exemplary embodiment of the present invention, FIG. 4 is a cross-sectional view of the liquid crystal display shown in FIG. 3 taken along the lines IV-IV', IV'-IV", and IV"-IV''', and FIG. 5 is a layout view of the pixel electrode of the liquid crystal display of FIG. 4.

Referring to FIG. 2, the liquid crystal display according to an exemplary embodiment of the present invention includes signal lines including neighboring first and second gate lines GLa and GLb, a data line DL, a storage electrode line CL, and a plurality of pixels PX that are connected to the signal lines (only one pixel PX is illustrated in FIG. 2 for the purposes of simplicity).

Each pixel PX includes first, second, and third switching elements Qa, Qb, and Qc, first and second liquid crystal capacitors Clca and Clcb, and a step-down capacitor Cstd.

The first switching element Qa and the second switching element Qb are respectively connected to the first gate line GLa and the data line DL, and the third switching element Qc is connected to the second gate line GLb.

The first and second switching elements Qa and Qb are three terminal elements such as thin film transistors provided in the lower panel 100, and they have control terminals connected to one of the first gates line GLa, input terminals connected to the data line DL, and output terminals connected to the first liquid crystal capacitor Clca and the second liquid crystal capacitor Clcb.

The third switching element Qc is also a three terminal element such as a thin film transistor provided in the lower panel 100, and has a control terminal connected to the second gate lines GLb, an input terminal connected to the second liquid crystal capacitor Clcb, and an output terminal connected to the step-down capacitor Cstd.

The step-down capacitor Cstd is connected to the output terminal of the third switching element Qc and the capacitor electrode line CL, and is formed by overlapping the capacitor electrode line CL provided in the lower panel 100 and the output electrode of the third switching element Qc via the insulator therebetween.

The liquid crystal display shown in FIG. 2 is described in detail below with reference to FIG. 3 to FIG. 5.

The liquid crystal display according to an exemplary embodiment of the present invention includes the lower panel 100 and the upper panel 200 facing each other, the liquid crystal layer 3 disposed between the two display panels 100 and 200, and a pair of polarizers (not shown) attached on the outer surfaces of the display panels 100 and 200, respectively.

The lower panel 100 is described in detail below.

A plurality of gate conductors including a plurality of first and second gate lines 121a and 121b and a plurality of storage voltage lines 131 are formed on an insulation substrate 110. The gate lines 121a and 121b are disposed near the center of the pixel, the first gate line 121a includes first and second gate electrodes 124a and 124b, and the second gate line 121b includes a third gate electrode 124c. The gate lines 121a and 121b include end portions 129 expanded for connection with an external device.

The storage voltage line 131 that transmits a predetermined storage voltage, is disposed on the upper portion of the pixel, and includes a stem substantially parallel to the gates line 121a and 121b and a plurality of branches extended therefrom. Each branch includes a longitudinal portion 134, a transverse portion 135, and a storage electrode 137. The stem of the storage voltage line 131 includes a storage electrode 133 having an area expanded upward and downward. The longitudinal portion 134 is extended downward from the stem of the storage voltage line 131, and the transverse portion 135 meets the longitudinal portion 134 perpendicularly. The storage electrode 137 protrudes from the transverse portion 135 from the central part of the transverse portion 135 to the right longitudinal portion 134. The shape and arrangement of the storage voltage line 131 may vary from that illustrated in the figures.

A gate insulating layer 140 is formed on the gate conductors 121a, 121b, and 131. A semiconductor stripe 151 is formed on the gate insulating layer 140. The semiconductor stripe 151 includes a stem extended in the vertical direction, and a first branch 154a, a second branch 154b, and a third branch 154c extending toward the first gate electrode 124a, the second gate electrode 124b, and the third gate electrode 124c, respectively. The first branch 154a, the second branch 154b, and the third branch 154c respectively include first to third elements (not shown) respectively disposed on the first gate electrode 124a, the second gate electrode 124b, and the third gate electrode 124c. The third branch 154c is extended to form a fourth branch 157.

An ohmic contact stripe 161 including a protrusion 164b, a first ohmic contact island (not shown), a second ohmic contact island (not shown), a third ohmic contact island (not shown), and a fourth ohmic contact island 167 are formed on the semiconductors 154a, 154b, 154c, and 157, respectively. The ohmic contact stripe 161 includes a first protrusion (not shown) formed in a pair with the first ohmic contact island and disposed on a first protrusion of the semiconductor, a second protrusion (not shown) formed in a pair with the second ohmic contact island and disposed on a second protrusion of the semiconductor, and a third protrusion (not shown) formed in a pair with the third ohmic contact island and disposed on a third protrusion of the semiconductor.

A data conductor including a plurality of data lines 171, and a plurality of first electrode members 175a, second electrode members 175b, and third electrode members 175c are formed on the ohmic contacts 161 and 167 and the gate insulating layer 140.

The data line 171 includes a plurality of first source electrodes 173a, second source electrodes 173b, and end portions 179 for connection with the other layer and/or the external driving circuit.

The first electrode member 175a forms the first drain electrode 175a. The second electrode member includes the second drain electrode 175b and a third source electrode 173c connected to each other. The third electrode member 175c forms the third drain electrode 175c.

The first, second, and third drain electrodes 175a, 175b, and 175c respectively include one end portion 177a, 177b, and 177c with a wide area and another end portion of a bar type. The bar end portions of the first drain electrode 175a, the second drain electrode 175b, and the third drain electrode 175c are enclosed by the first source electrode 173a, the second source electrode 173b, and the third source electrode 173c. The third source electrode 173c is connected to the second end portion 177b of the second drain electrode 175b.

The semiconductors 154a, 154b, 154c, and 157 have substantially the same planar shape as the data lines 171, the first to third electrode members 175a, 175b, and 175c, and the underlying ohmic contacts 164b and 167. However, the semiconductor stripe includes exposed portions that are not covered by the source electrodes 173a, 173b, and 173c and the drain electrodes 175a, 175b, and 175c, and portions that are disposed between the data lines 171 and the drain electrodes 175a, 175b, and 175c.

The first gate electrode 124a, the first source electrode 173a, and the first drain electrode 175a form the first thin film transistor Qa along with the first branch 154a of the semiconductor, the second gate electrode 124b, the second source electrode 173b, and the second drain electrode 175b form the second thin film transistor Qb along with the second branch 154b of the semiconductor, and the third gate electrode 124c, the third source electrode 173c, and the third drain electrode 175c form the third thin film transistor Qc along with the third branch 154c of the semiconductor. The channels of the thin film transistors are respectively formed in the semiconductors 154a, 154b, and 154c between the source electrodes 173a, 173b, and 173c, and the drain electrodes 175a, 175b, and 175c.

A lower passivation layer 180p is formed on the data conductors 171, 175a, 175b, and 175c and the exposed semiconductors 154a, 154b, and 154c.

The lower passivation layer 180p is made of an inorganic insulator such as silicon nitride or silicon oxide, and may reduce or prevent the components of color filters 230 formed thereon from being diffused into the underlying thin film transistor.

A plurality of color filters 230 are formed on the lower passivation layer 180p. The color filters 230 may each display one of the additive primary colors such as the colors red, green, and blue, and may be made of an organic material including pigments displaying one of these three additive primary colors. The thickness of the color filters 230 may be in the range of about 1.0 μm to 2.5 μm, and may be thinner than a general color filter formed through a photo process. Each color filter 230 is extended upward and downward from a region where two gate lines 121a and 121b are positioned such that it is not formed in the region where the first to third thin film transistors Qa, Qb, and Qc are positioned.

An upper passivation layer 180q is formed on the lower passivation layer 180p and the color filters 230. The upper passivation layer 180 may be made of an inorganic insulator or an organic insulator. The upper passivation layer 180q may reduce the coupling capacitance between the pixel electrodes 191 and the data lines 171, and may have a thickness of more than 1.0 μm for planarizing the substrate. The upper passivation layer 180q prevents the color filters 230 from lifting and suppresses contamination of the liquid crystal layer 3 by the organic material such as a solvent flowing from the color filters 230 such that defects such as an afterimage that may be generated during driving may be prevented.

When the thickness of the upper passivation layer 180q is different across the TFT depending on the relative position thereto, the thickness D1 of the first portion of the upper passivation layer 180q disposed on the color filter 230 may be more than 1.0 μm. For example, the thickness D1 may be more than about 2.0 μm, the thickness D2 of the second portion of the upper passivation layer 180q disposed in the pixel area where the color filter 230 occupies may be more than about 1.0 μm, and the thickness D3 of the third portion of the upper passivation layer 180q near the end portions 129 and 179 of the gate lines 121a and 121b and the data line 171 may be less than 1.5 μm, for example, about 0.5 μm to 1.0 μm. The thickness of the upper passivation layer 180q may be still thinner from the first portion to the third portion. Also, the difference between the thickness D1 of the first portion and the thickness D2 of the second portion of the upper passivation layer 180q may be in the range of about 2.0 μm to 3.0 μm.

The upper passivation layer 180q and the lower passivation layer 180p have a plurality of contact holes 185a and 185b exposing the first expansion 177a of the first drain electrode 175a and the second expansion 177b of the second drain electrode 175b, respectively. A plurality of contact holes 182 exposes the end portions 179 of the data lines 171. The upper passivation layer 180q, the lower passivation layer 180p, and the gate insulating layer 140 have a plurality of contact holes 181 and 185c exposing the end portions 129 of the gate lines 121a and 121b and a portion of the storage electrode 137, respectively.

The contact holes 181, 182, 185a, 185b, and 185c are disposed in the pixel area where the color filter 230 is formed, and the thickness D2 and D3 of the upper passivation layer 180q of this portion is thinner than the thickness D1 of the upper passivation layer 180q disposed on the color filter 230. Accordingly, contact characteristic deterioration caused when unwanted organic layer remains when forming the contact holes 181, 182, 185a, 185b, and 185c may be reduced or prevented.

A plurality of pixel electrodes 191, a plurality of contact assistants 81 and 82, and a plurality of shielding electrodes 88 are formed on the upper passivation layer 180q, and the color filters 230 may be extended according to a column of the pixel electrodes 191. The pixel electrodes 191, the contact assistants 81 and 82, and the shielding electrode 88 may be made of a transparent material such as ITO and IZO.

Referring to FIG. 3, each pixel electrode 191 includes first and second subpixel electrodes 191a and 191b that are separated from each other via two gate lines 121a and 121b, disposed upward and downward of the pixel area with respect to the gate lines 121a and 121b, and neighboring in the column direction, and the first and second subpixel electrodes 191a and 191b respectively include a basic electrode 199 shown in FIG. 5, or at least one modification thereof.

The basic electrode 199 is described in detail below with reference to FIG. 5.

As shown in FIG. 5, the overall shape of the basic electrode 199 is a quadrangle, and includes a cross-shaped stem having a transverse stem 193 and a longitudinal stem 192 that are crossed. Also, the basic electrode 199 is divided into a first sub-region Da, a second sub-region Db, a third sub-region Dc, and a fourth sub-region Dd by the transverse stem 193 and the longitudinal stem 192. Each of the sub-regions Da-Dd includes a plurality of first to fourth minute branches 194a, 194b, 194c, and 194d, respectively.

The first minute branch 194a obliquely extends from the transverse stem 193 or the longitudinal stem 192 in the upper-left direction. The second minute branch 194b obliquely extends from the transverse stem 193 or the longitudinal stem 192 in the upper-right direction. The third minute branch 194c obliquely extends from the transverse stem 193 or the longitudinal stem 192 in the lower-left direction. The fourth minute branch 194d obliquely extends from the transverse stem 193 or the longitudinal stem 192 in the lower-right direction.

The first to fourth minute branches 194a-194d form an angle of about 45 degrees or 135 degrees with the gate lines 121 or the transverse stem 193. Also, the minute branches 194a-194d of two neighboring sub-regions Da-Dd may be crossed.

The width of the minute branches 194a, 194b, 194c, and 194d may each be in the range of 2.5 μm to 5.0 μm. The interval between the neighboring minute branches 194a, 194b, 194c, and 194d of one sub-region Da, Db, Dc, and Dd may be in the range of 2.5 μM to 5.0 μm.

According to an exemplary embodiment of the present invention, the widths of the minute branches 194a to 194d may be enlarged when coming closer to the transverse stem 193 or the longitudinal stem 192. The difference between the widest width of the minute branches and the narrowest width thereof may be in the range of 0.2 μm to 1.5 μm in one of the minute branches 194a, 194b, 194c, and 194d.

The first and second sub-pixel electrodes 191a and 191b are respectively connected to the first and second drain electrodes 175a and 175b through the contact holes 185a and 185b. The first and second sub-pixel electrodes 191a and 191b receive data voltages from the first and second drain electrodes 175a and 175b, respectively. The first/second sub-pixel electrode 191a/191b applied with the data voltage generates an electric field along with the common electrode 270 of the common electrode panel 200 such that the orientation of the liquid crystal molecules of the liquid crystal layer 3 between the electrodes 191a/191b and 270 is determined. Accordingly, the luminance of the light transmitted through the liquid crystal layer 3 differs depending on the orientation of the liquid crystal molecules and in this way, the luminance of the light may be controlled by the alignment of the liquid crystal layer 3.

The edges of the first to fourth cutouts 194a-194d distort the electric field, and form a horizontal component that determines an inclined direction of liquid crystal molecules 31. The horizontal component of the electric field is almost parallel to the edges the first to fourth minute branches 194a-194d. Accordingly, liquid crystal molecules 31 are inclined in the direction parallel to the length direction of the minute branches 194a-194d. The length directions in which the minute branches 194a-194d are extended in one pixel PX are all four directions such that the inclined directions of the liquid crystal molecules 30 are all four directions, and four domains including the different alignment directions of liquid crystal molecule 31 are formed in the liquid crystal layer 3. The viewing angle of the liquid crystal display is widened by varying the inclined directions of the liquid crystal molecules.

The second sub-pixel electrode 191b is physically and electrically connected to the third source electrode 173c through the contact hole 185b.

The storage electrode 137 and the wide end portion 177c of the third drain electrode 175c overlap via the gate insulating layer 140 and the semiconductor layer 157 and 167, thereby forming the step-down capacitor Cstd. According to an exemplary embodiment of the present invention, the semiconductor layers 157 and 167 disposed between the storage electrode 137 and the expansion 177c of the third drain electrode 175c forming the step-down capacitor Cstd may be omitted.

The contact assistants 81 and 82 are connected to the end portions 129 of the gate lines 121a and 121b and the end portions 179 of the data lines 171 through the contact holes 181 and 182, respectively. The contact assistants 81 and 82 enhance adhesion of the end portions 129 of the gate lines 121a and 121b and the end portions 179 of the data lines 171 to external devices, and protect them.

The shielding electrode 88 includes a longitudinal portion extended according to the data line 171 of the region where the first subpixel electrode 191a is disposed and a transverse portion extended according to the gate lines 121a and 121b. The longitudinal portion completely covers a portion of the data line 171. The transverse portion is connected to a portion of the storage electrode 137 through the contact hole 185c. The shielding electrode 88 receives a predetermined voltage from the storage electrode 137 and blocks the electric field between the pixel electrodes 191, between the data line 171 and the common electrode 270, such that voltage distortion of the pixel electrode 191 and signal delay of the data voltage transmitted to the data line 171 is reduced.

A light blocking member 220 is formed on the pixel electrode 191 and the exposed upper passivation layer 180q. The light blocking member 220 is referred to as a black matrix and prevents light leakage.

The light blocking member 220 includes a straight area 220a according to the gate line 121 and the data line 171, and an expansion 220b expanded up and down according to the gate line and disposed in the region where the first to the third thin film transistors Qa, Qb, and Qc are positioned.

The thickness of the light blocking member 220 may be equal to the difference between the sum of the thickness of the color filter 230, the thickness D1 of the first portion of the upper passivation layer 180q thereof, and the thickness D2 of the second portion of the upper passivation layer 180q, and may be, for example, more than about 2 μm.

The light blocking member 220 is disposed on the second portion of the upper passivation layer 180q. The surface height of the light blocking member 220 may be almost equal to the height of the first portion of the upper passivation layer 180q disposed on the color filter 230. Accordingly, although the light blocking member 220 is formed on the upper passivation layer 180q made of the organic insulator, the light blocking member 220 is not protruded upward such that a uniform cell, for example, the thickness of the liquid crystal layer 3, may be maintained. Although the light blocking member 220 is protruded upward rather than the closed portion such that the height of the surface thereof is higher than the other, the difference due to the protrusion may be less than about 1.0 μm, and may be, for example about 0.5 μm.

A lower alignment layer (not shown) is formed on the pixel electrode 191, the contact assistants 81 and 82, the exposed upper passivation layer 180q, and the light blocking member 220. The lower alignment layer may be a vertical alignment layer.

The upper panel 200 is described in detail below.

A common electrode 270 is formed on an insulation substrate 210. An upper alignment layer (not shown) is formed on the common electrode 270. The upper alignment layer may be a vertical alignment layer.

The liquid crystal layer 3 has negative dielectric anisotropy. The liquid crystal molecules of the liquid crystal layer 3 are arranged such that a longitudinal axis of the liquid crystal molecules may be perpendicular to the surfaces of the two panels 100 and 200 in the case in which an electric field does not exist.

According to an exemplary embodiment of the present invention, the liquid crystal display may further include a spacer to maintain the uniform cell gap between the two display panels 100 and 200. The spacer may be simultaneously formed with the same layer as the light blocking member 220.

Next, a manufacturing method for a thin film transistor array panel 100 for the above-described liquid crystal display is described in detail below with reference to FIG. 6 to FIG. 12B as well as FIG. 3 and FIG. 4.

FIG. 6 to FIG. 12B are cross-sectional views sequentially showing a manufacturing method of a thin film transistor array panel of the liquid crystal display shown in FIG. 3 and FIG. 4.

Figure 6:
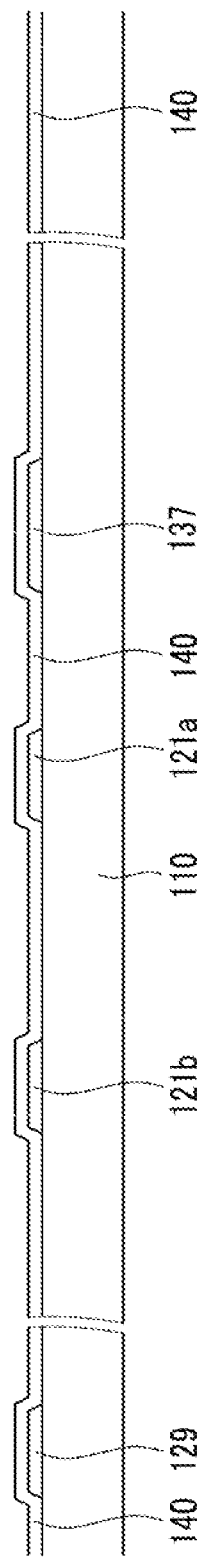
FIG. 6 to FIG. 11 are cross-sectional views sequentially showing a manufacturing method of a thin film transistor array panel of the liquid crystal display shown in FIG. 3 and FIG. 4 according to an exemplary embodiment of the present invention.
Figure 7:
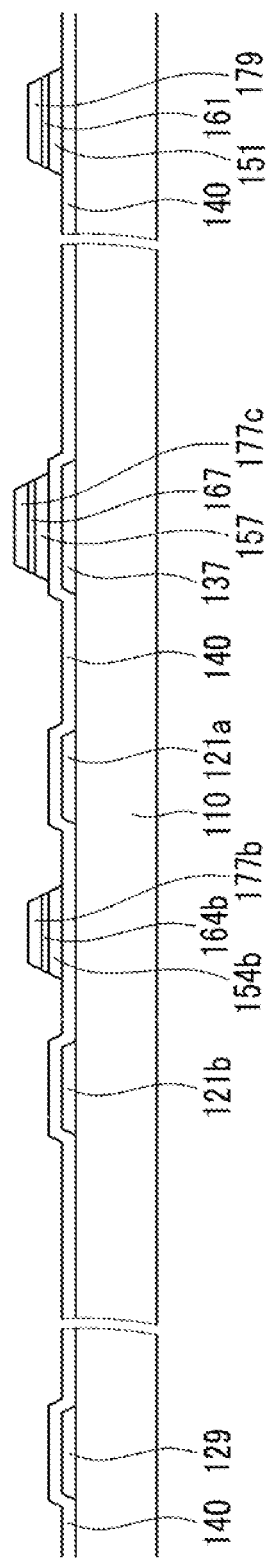

As shown in FIG. 6, a gate conductor having the first gate line 121a including the first gate electrode 124a, the second gate electrode 124b and a wide end portion 129, the second gate line 121b including the third gate electrode 124c and a wide end portion (not shown), and a storage electrode line 131a including a storage electrode 133 and a storage electrode 137 is formed on an insulation substrate 110. A gate insulating layer 140 is deposited thereon.

An intrinsic amorphous silicon layer that is not doped with an impurity, an extrinsic amorphous silicon layer that is doped with an impurity, and a data conductive layer are sequentially formed on the substrate 110. Next, a photosensitive film (not shown) is coated on the data conductive layer, and is exposed and developed by using a slit mask to form a photosensitive pattern having different thicknesses. Next, the data conductive layer, the intrinsic amorphous silicon layer, and the extrinsic amorphous silicon layer are firstly etched by using the photoresist pattern as a mask to form semiconductors 154b and 157, and then the data conductive layer is secondly etched to form data lines 171 including the first source electrodes 173a and the second source electrodes 173b, the wide end portions 179, the first to third drain electrodes 175a, 175b, and 175c including the first to third expansions 177a, 177b, and 177c and the third source electrode 173c, and semiconductors 154a, 154b, 154c, and 157.

Next, the exposed amorphous silicon layer is removed by using the source electrodes 173a, 173b, and 173c and the drain electrodes 175a, 175b, and 175c as a mask to form ohmic contact layers 164b and 167.

In this way, in the manufacturing method of the thin film transistor array panel 100 according to an exemplary embodiment of the present invention, the data conductor 171, 175a, 175b, and 175c, the semiconductors 154a, 154b, 154c, and 157, and the ohmic contacts 161 and 167 are formed through a single photolithography process.

A photosensitive film used in this photolithography process has different thicknesses depending on positions, and particularly includes a first portion and a second portion in which the thicknesses are reduced. The first portion is located at a wiring region provided with the data line 171 and the drain electrodes 175a, 175b, and 175c. The second portion is located at a channel region of the thin film transistor.

There are many methods for forming the difference in thicknesses according to the location of the photosensitive film that fall within the scope of the present invention. One example of the methods includes forming a photomask with a translucent area as well as a light transmitting area and a light blocking area. The translucent area is provided with a slit pattern or a lattice pattern, or as a thin film having medium transmittance or thickness. In the case of utilizing the slit pattern, it is preferable that the slit width or the space between the slits is smaller than the resolution of exposure equipment used in the photolithography process. Exemplary methods may include using a reflowable photosensitive film. For example, the method forms a thin portion by making a photosensitive film flow into a region where the photosensitive film is not present after forming the reflowable photosensitive film with a general exposure mask having only a light transmitting area and a light blocking area.

Since this reduces time for the photolithography process, the manufacturing method is simplified.

Figure 8:
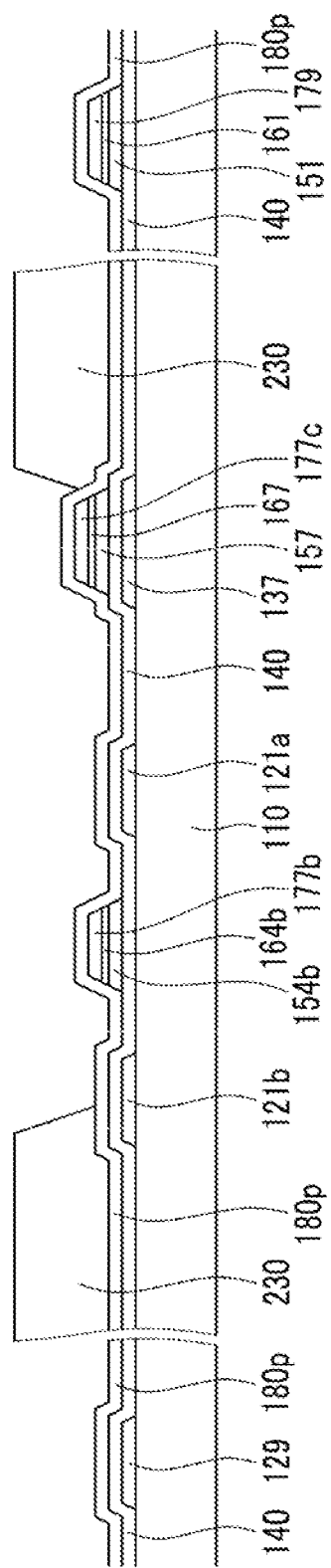

Next, as shown in FIG. 8, a lower passivation layer 180p is formed on the data conductors 171, 175a, 175b, and 175c and the gate insulating layer 140, and a photosensitive organic material for a color filter 230 is formed on the lower passivation layer 180p and exposed and developed by using a photomask to form a color filter 230.

Figure 9:
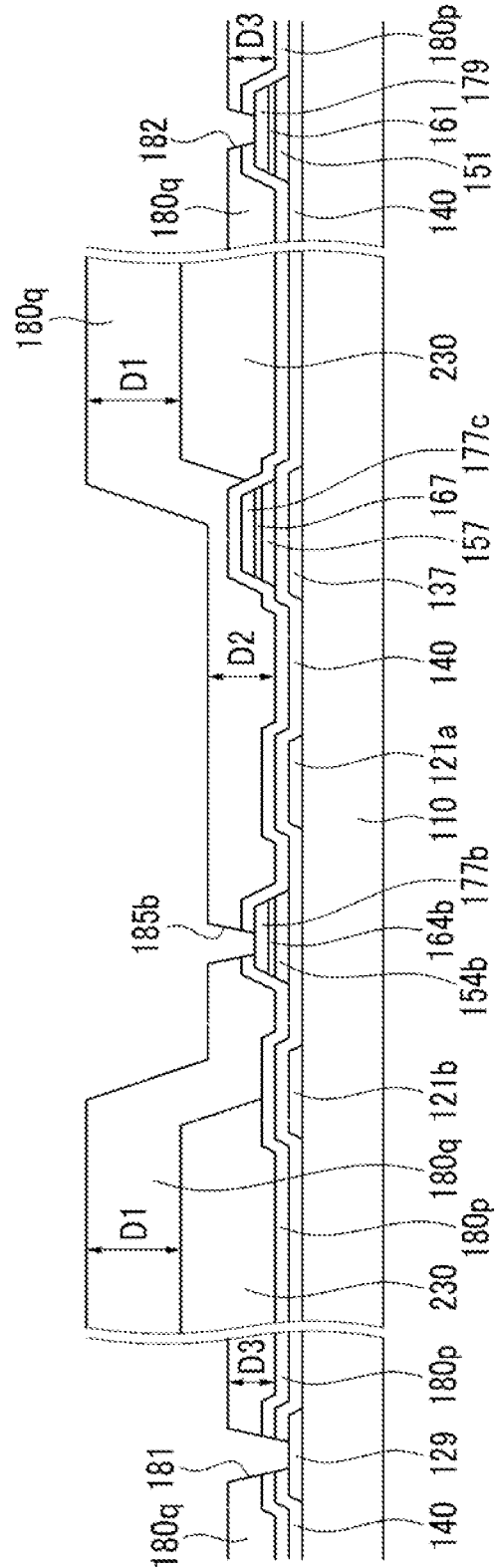
Figure 10A:
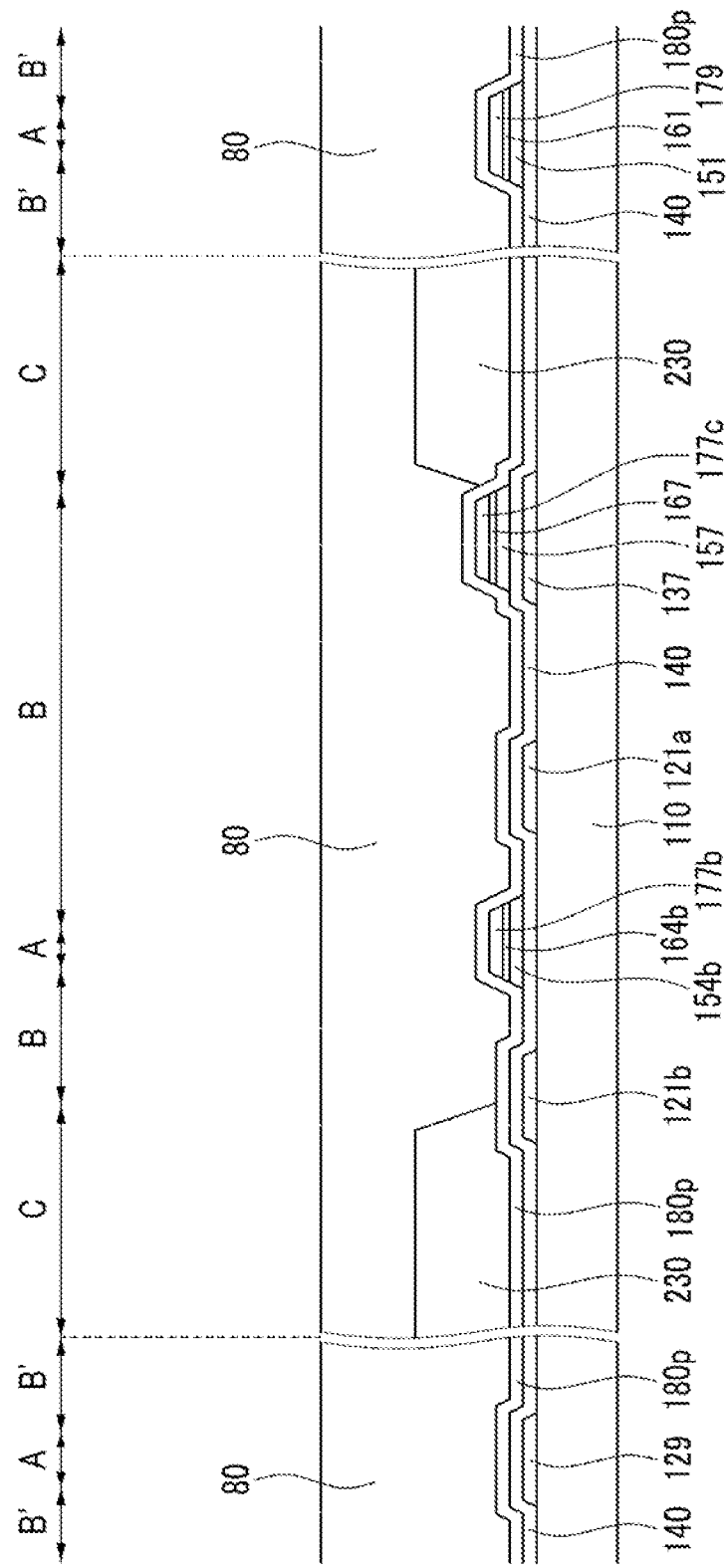
Figure 10B:
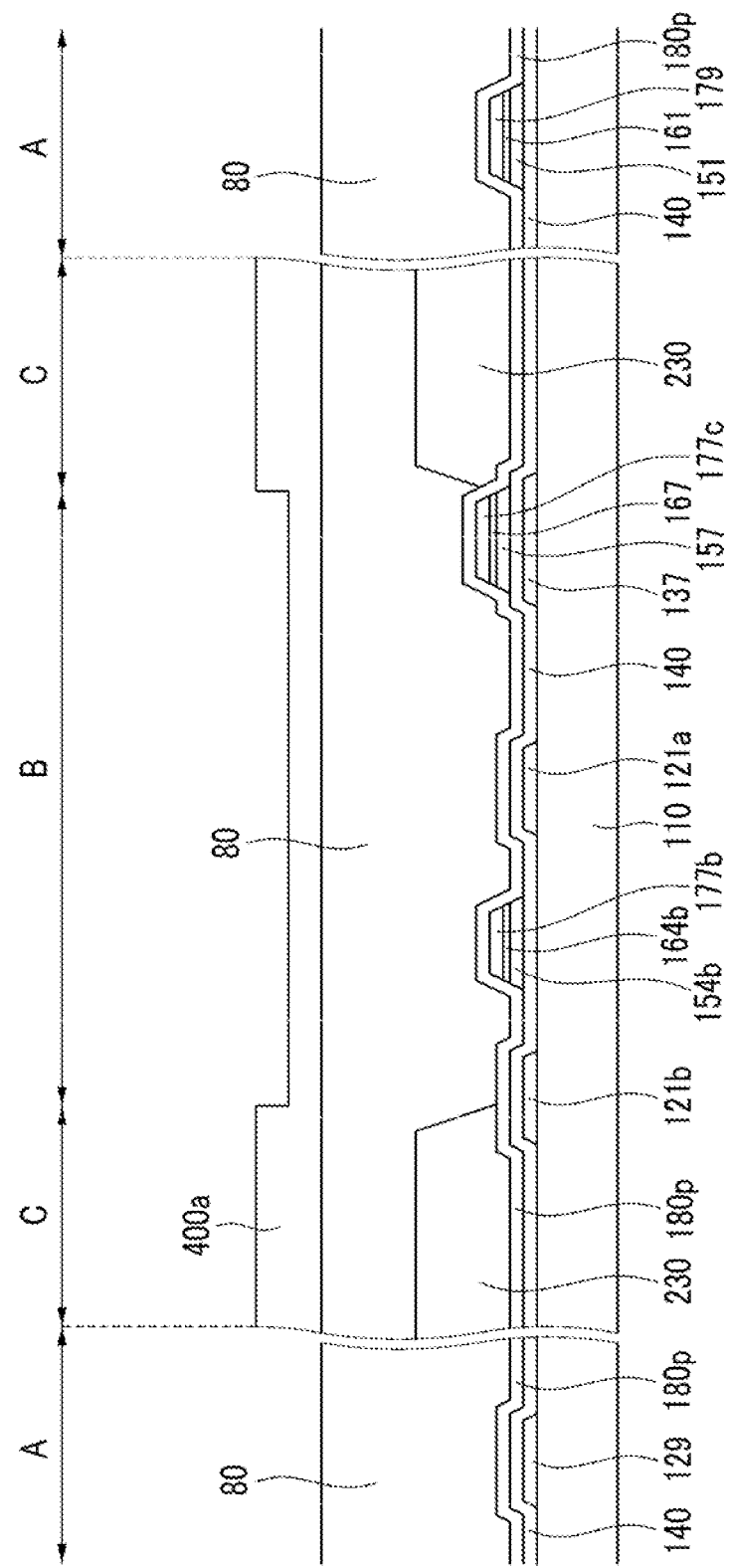
Figure 10C:
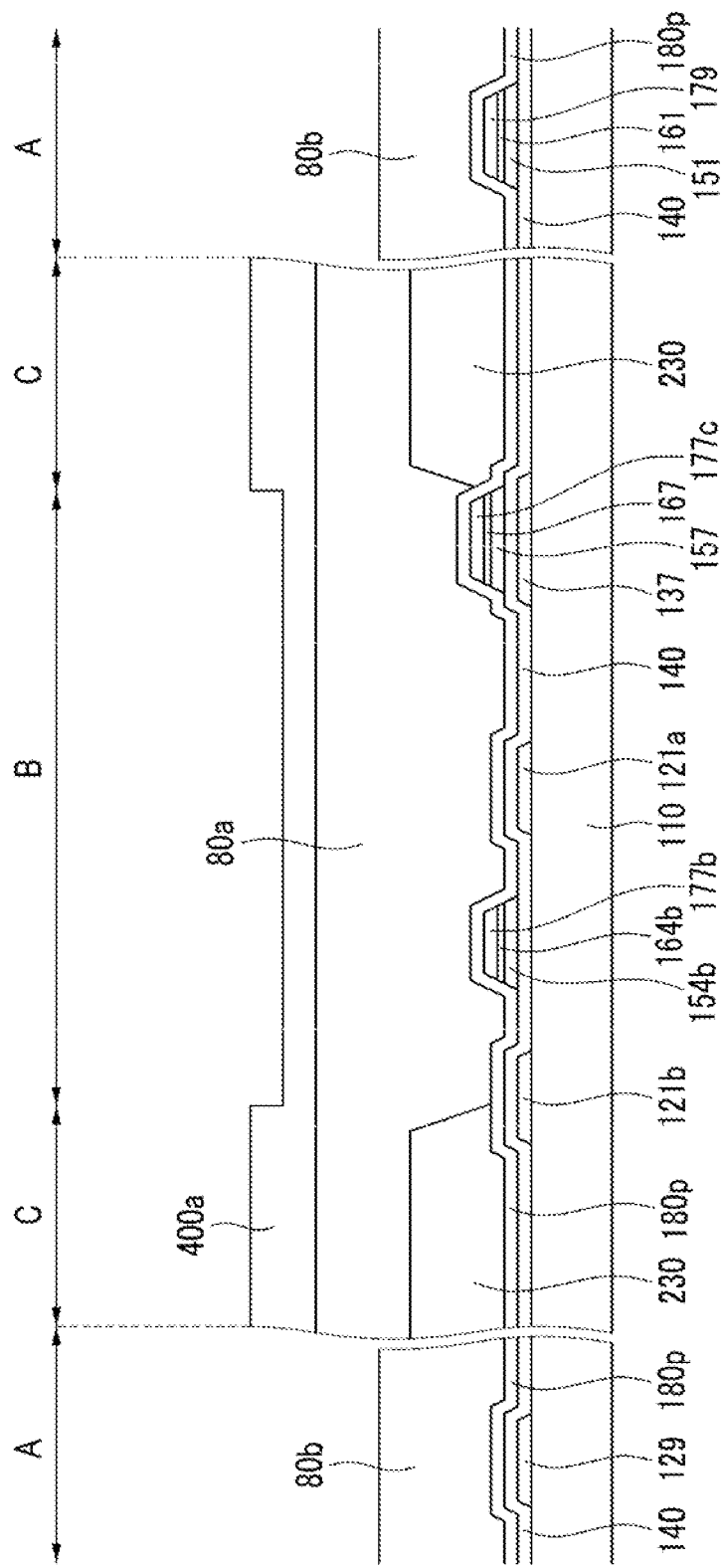
Figure 10D:
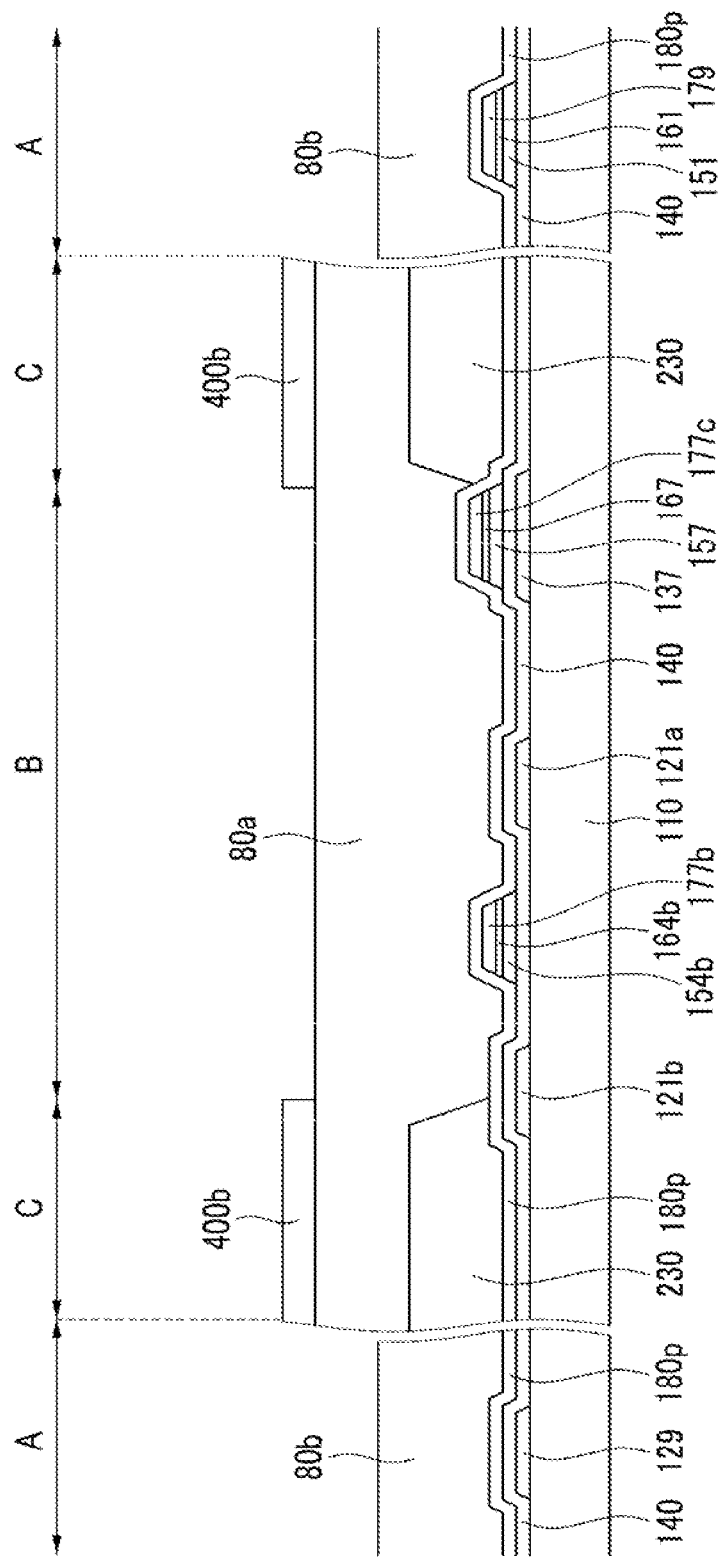
Figure 10E:
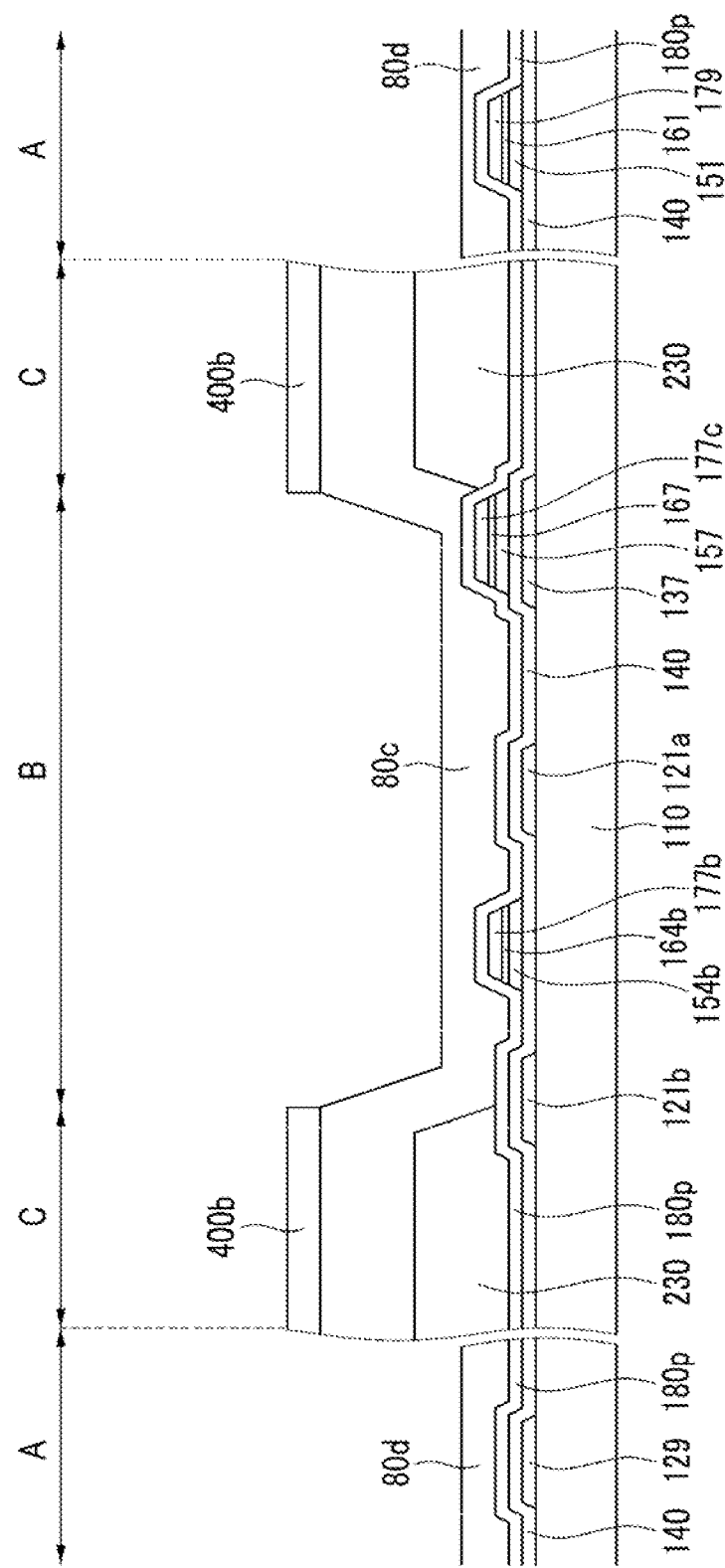

As shown in FIG. 9, an upper passivation layer 180q having a thickness that depends on position is formed on the color filter and the lower passivation layer 180p. The thickness D1 of the first portion of the upper passivation layer 180q disposed on the color filter 230 may be more than 1.0 µm, and may be, for example, more than about 2.0 µm. The thickness D2 of the second portion of the upper passivation layer 180q disposed in the pixel area where the color filter 230 occupies may be more than 1.0 µm. The thickness D3 of the third portion of the upper passivation layer 180q near the end portions 129 and 179 of the gate lines 121a and 121b and the data line 171 may be less than 1.5 µm, for example, may be about 0.5 µm to 1.0 µm. The thickness of the upper passivation layer 180q is thinner than that of the first portion to the third portion. Also, the difference between the thickness D1 of the first portion and the thickness D2 of the second portion of the upper passivation layer 180q may be in the range of about 2.0 µm to 3.0 µm.

To form the lower passivation layer 180p having the different thickness depending on the position, as shown in FIGS. 10A-10E, an organic layer 80 having photosensitivity is coated on the color filter 230 and the lower passivation layer 180p, and may be exposed and developed by using a photomask having translucent regions B and B' as well as a transmissive region A and a light blocking region C. In the shown exemplary embodiment, in the case of the translucent regions B and B', the intensity of the light passing through the region B' may be stronger than the intensity of the light passing through the region B.

By exposing by using the photomask having at least three regions having different intensities of the transmitted light, the thickness of the remaining organic layer is different according to the intensity of the light after exposing and developing. In the exemplary embodiment shown in FIGS. 10A-10E, the photosensitive organic layer 80 has positive photosensitivity such that the thickness of the remaining photosensitive organic layer 80 is reduced as the intensity of the light is increased. However, when the photosensitive organic layer 80 has negative photosensitivity, the thickness of the remaining photosensitive organic layer 80 may be increased as the intensity of the light is increased. In this case, the transmittance of the light according to the position of the photomask used to form the lower passivation layer 180p having the different thickness is opposite to that described above with reference to FIGS. 10A-10E. The translucent region includes a slit pattern, a lattice pattern, or a thin film having median transmittance or having a median thickness.

As described above, when using the upper passivation layer 180q of the photosensitive organic material, the upper passivation layer 180q is exposed and developed. The lower passivation layer 180p and the gate insulating layer 140 are dry-etched by using the upper passivation layer 180q as a mask to form a plurality of contact holes 185a and 185b exposing the first expansion 177a of the first drain electrode 175a and the second expansion 177b of the second drain electrode 175b, a plurality of contact holes 182 exposing the end portions of the data lines 171, a plurality of contact holes 181 exposing the end portions 129 of the gate lines 121a and 121b, and a plurality of contact holes 185c exposing the portions of the storage electrodes 137.

Although not shown, according to an exemplary embodiment of the present invention, the upper passivation layer 180q may be made of a non-photosensitive organic material. In this case, an organic layer is coated and a photosensitive film is coated thereon. Then the photosensitive film is exposed and developed by using a photomask having at least three regions having different transmittance as shown in FIGS. 10A-10E, to etch the organic layer such that the upper passivation layer 180q having the different thicknesses depending on the positions may be formed.

Figure 11:
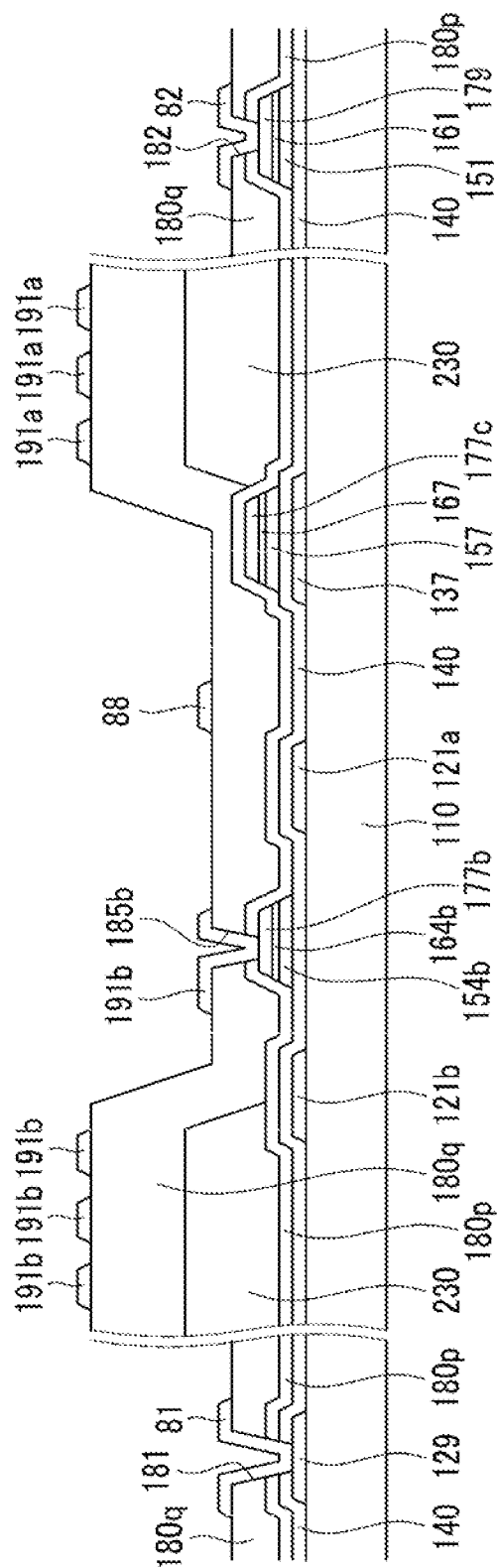

Next, as shown in FIG. 11, a plurality of pixel electrodes 191, a plurality of contact assistants 81 and 82, and a plurality of shielding electrodes 88 are formed on the upper passivation layer 180q. A method for manufacturing the plurality of pixel electrodes 191a and 191b, the plurality of contact assistants 81 and 82, and the plurality of shielding electrodes 88 on the upper passivation layer 180q is described in detail below with reference to FIG. 12A and FIG. 12B.

Figure 12A:
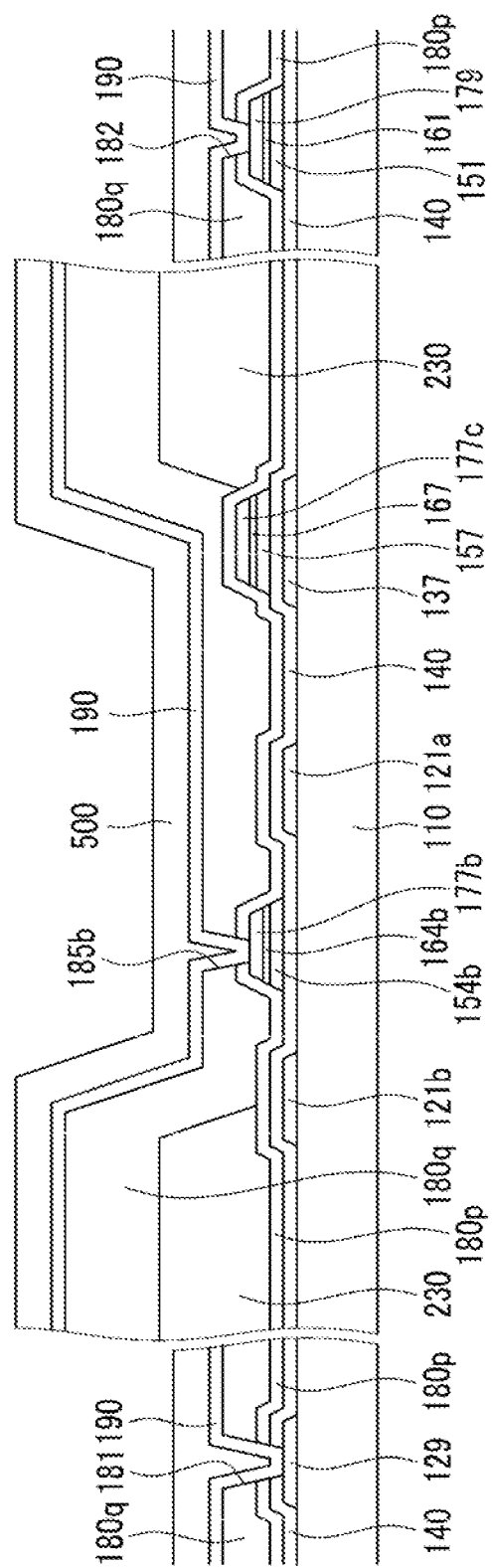
FIG. 12A and FIG. 12B are cross-sectional views sequentially showing a step for manufacturing the thin film transistor array panel shown in FIG. 11 according to an exemplary embodiment of the present invention.
Figure 12B:
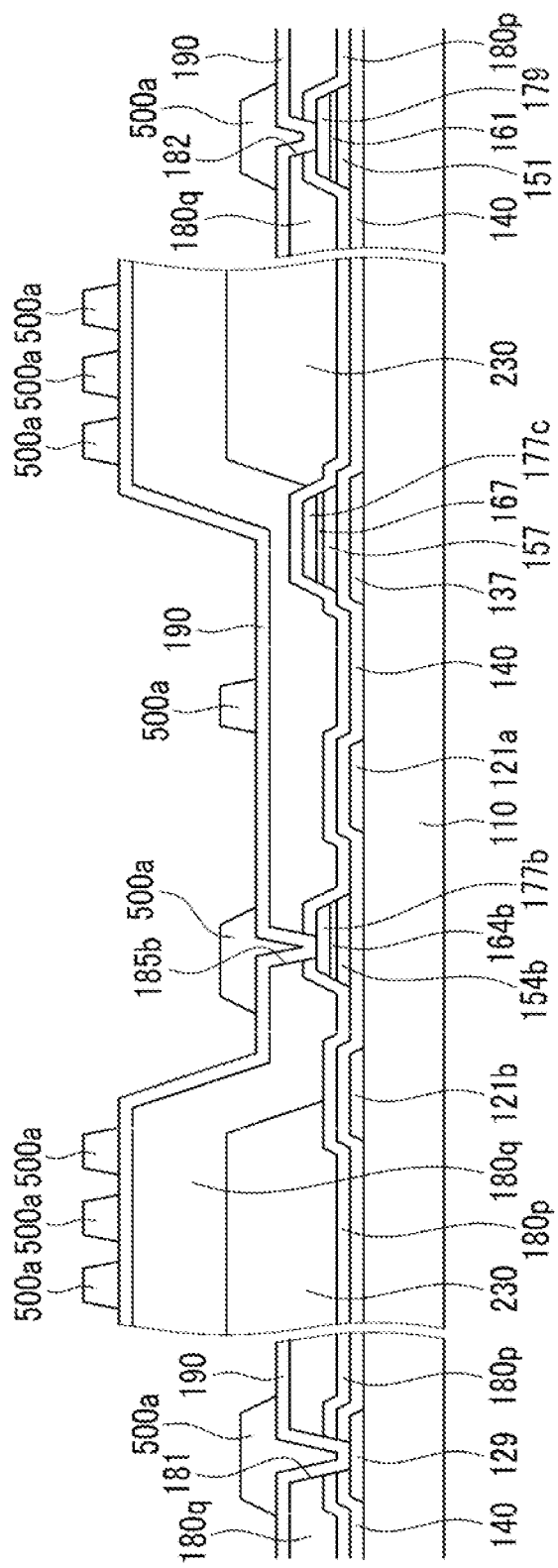

FIG. 12A and FIG. 12B are cross-sectional views sequentially showing a step for manufacturing the thin film transistor array panel shown in FIG. 11.

Referring to FIG. 12A, a transparent conductive layer 190 such as ITO and IZO is deposited on the upper passivation layer 180q, and a photosensitive film 500 is coated thereon and exposed and developed. As shown in FIG. 12B, the photosensitive film pattern 500a is formed and the conductive layer 190 is etched using the photosensitive film pattern 500a as a mask to form the pixel electrode 191, the contact assistants 81 and 82, and the shielding electrode 88. Here, the photosensitive film 500 may have negative photosensitivity. The photosensitive film 500 has negative photosensitivity such that the portion that is not exposed may be completely removed after developing. The thickness of the upper passivation layer 180q is different depending on the positions such that a step is formed on the surface of the upper passivation layer 180q and the conductive layer 190 may remain on a portion corresponding to the step. However, the portion that is not exposed is completely removed by using the photosensitive film 500 having the negative photosensitivity such that the desired photosensitive film pattern 500a may be formed, and thereby a short circuit deterioration due to the remaining conductive layer 190 of the unwanted portion may be prevented.

Next, as shown in FIG. 3 and FIG. 4, the light blocking member 220 is formed on the second portion of the upper passivation layer 180q disposed on the pixel area where the color filter 230 is not present. The surface height of the light blocking member 220 may be almost equal to the surface height of the first portion of the upper passivation layer 180q disposed on the color filter 230.

In the manufacturing method of a thin film transistor array panel according to an exemplary embodiment of the present invention, a spacer (not shown) controlling the cell gap of the liquid crystal display along with the light blocking member 220 may be formed substantially simultaneously with the light blocking member 220.

As described above, regarding a thin film transistor array panel and a manufacturing method thereof according to an exemplary embodiment of the present invention, the surface height of the light blocking member is almost equal to the surface height of the organic layer such that the uniform cell gap of the liquid crystal display may be maintained. The organic layer does not remain upon forming the contact hole while the organic layer completely covers the color filter by controlling the height of the organic layer per the regions such that the contact characteristics may not be deteriorated.

While exemplary embodiments of the present invention have been described with reference to the figures, it is to be understood that the invention is not limited to the disclosed embodiments, but, on the contrary, is intended to cover various modifications and equivalent arrangements.

What is claimed is:

1. A thin film transistor array panel comprising:
   an insulation substrate;
   a signal line formed on the insulation substrate;
   a thin film transistor connected to the signal line;
   a color filter formed on the insulation substrate;
   an organic insulator formed on the color filter, and including a first portion and a second portion having different thicknesses; and
   a light blocking member formed on the second portion of the organic insulator,
   wherein a thickness of the light blocking member is substantially equal to a difference between a surface height of the first portion of the organic insulator and a surface height of the second portion of the organic insulator.

2. The thin film transistor array panel of claim 1, wherein a difference between the surface height of the first portion of the organic insulator and the surface height of the second portion of the organic insulator is in a range of about 2.0 μm to about 3.0 μm and wherein the thickness of the light blocking member is in the range of about 2.0 μm to 3.0 μm.

3. The thin film transistor array panel of claim 1, wherein the difference between a surface height of the first portion of the organic insulator and a surface height of the light blocking member is less than about 0.5 μm.

4. The thin film transistor array panel of claim 1, wherein the signal line includes an end portion and the organic insulator further includes a third portion having a different thickness than that of the first portion and the second portion and the third portion of the organic insulator is disposed near an end portion of the signal line.

5. The thin film transistor array panel of claim 4, wherein the thickness of the third portion of the organic insulator is in the range of about 0.5 μm to 1.0 μm.

6. The thin film transistor array panel of claim 1, further comprising:
   a pixel electrode electrically connected to the thin film transistor through a contact hole, and wherein the contact hole is disposed in the second portion of the organic insulator.

7. The thin film transistor array panel of claim 1, further comprising a spacer formed of the same layer as the light blocking member.

8. A method for manufacturing a thin film transistor array panel comprising:
   forming a thin film transistor connected to a plurality of signal lines on a substrate;
   forming a lower passivation layer on the thin film transistor and the substrate;
   forming a color filter on the lower passivation layer;
   forming an upper passivation layer including a first portion and a second portion, each having a different thicknesses, on the lower passivation layer and the color filter; and
   forming a light blocking member on the second portion of the upper passivation layer,
   wherein a thickness of the light blocking member is substantially equal to a difference between a surface height of the first portion of the organic insulator and a surface height of the second portion of the organic insulator.

9. The method of claim 8, wherein a difference between a surface height of the first portion of the upper passivation layer and a surface height of the second portion of the upper passivation layer is in the range of about 2.0 μm to 3.0 μm.

10. The method of claim 8, wherein the formation of the upper passivation layer includes exposing a photosensitive film to light using an exposure mask having a translucent region as well as a transmissive region and a light blocking region.

11. The method of claim 8, wherein a difference between a surface height of the first portion the upper passivation layer and a surface height of the light blocking member is less than about 0.5 μm.

12. The method of claim 8, wherein a thickness of the light blocking member is in the range of about 2.0 μm to 3.0 μm.

13. The method of claim 8, further comprising forming a contact hole in the second portion of the upper passivation layer.

14. The method of claim 13, further comprising forming a pixel electrode connected to the thin film transistor through the contact hole, wherein the formation of the pixel electrode includes:
   forming a conductive layer on the color filter and the upper passivation layer;
   coating a photosensitive film on the conductive layer;
   forming a photosensitive film pattern by exposing and developing the photosensitive film; and
   etching the conductive layer while using the photosensitive film pattern as a mask, wherein the photosensitive film has negative photosensitivity.

15. The method of claim 8, wherein the upper passivation layer further includes a third portion having a different thickness than that of the first portion and the second portion.

16. The method of claim 15, wherein the thickness of the third portion of the upper passivation layer is in the range of about 0.5 μm to 1.0 μm.

17. The method of claim 8, further comprising forming a pixel electrode connected to the thin film transistor, wherein the formation of the pixel electrode includes:
   forming a conductive layer on the color filter and the upper passivation layer;

coating a photosensitive film on the conductive layer;
forming a photosensitive film pattern by exposing and developing the photosensitive film; and
etching the conductive layer using the photosensitive film pattern as a mask,
wherein the photosensitive film has negative photosensitivity.

18. The method of claim 8, wherein the forming of the light blocking member includes forming a spacer made of a same layer as the light blocking member.

19. A thin film transistor array panel comprising:
a substrate;
a signal line formed on the substrate;
a thin film transistor connected to the signal line;
a lower passivation layer on the thin film transistor and the substrate;
a color filter formed on the lower passivation layer;
an upper passivation layer including a first portion and a second portion, each having a different thickness, on the lower passivation layer and the color filter; and
a light blocking member formed on the second portion of the upper passivation layer,
wherein a thickness of the light blocking member is substantially equal to a difference between a surface height of the first portion of the organic insulator and a surface height of the second portion of the organic insulator.

* * * * *